(12) United States Patent
Chehade et al.

(10) Patent No.: US 12,156,370 B2
(45) Date of Patent: Nov. 26, 2024

(54) RACK SYSTEM FOR HOUSING AN ELECTRONIC DEVICE

(71) Applicant: OVH, Roubaix (FR)

(72) Inventors: Ali Chehade, Moncheaux (FR); Alexandre Alain Jean-Pierre Meneboo, Harnes (FR); Gregory Francis Louis Bauchart, Wattrelos (FR); Henryk Klaba, Roubaix (FR)

(73) Assignee: OVH, Roubaix (FR)

( * ) Notice: Subject to any disclaimer, the term of this patent is extended or adjusted under 35 U.S.C. 154(b) by 219 days.

(21) Appl. No.: 17/697,616

(22) Filed: Mar. 17, 2022

(65) Prior Publication Data

US 2022/0322561 A1  Oct. 6, 2022

(30) Foreign Application Priority Data

Apr. 1, 2021 (EP) .................................. 21305427
Aug. 31, 2021 (EP) .................................. 21306187

(51) Int. Cl.
*H05K 7/20* (2006.01)
*F28D 21/00* (2006.01)
(Continued)

(52) U.S. Cl.
CPC ......... *H05K 7/20236* (2013.01); *F28D 21/00* (2013.01); *F28F 3/027* (2013.01);
(Continued)

(58) Field of Classification Search
CPC ............... H05K 7/203; H05K 7/20809; H05K 7/20236; H05K 7/20772; H05K 7/20781;
(Continued)

(56) References Cited

U.S. PATENT DOCUMENTS 2,115,501 A    4/1938   Sergius
2,316,296 A    4/1943   Simonds
(Continued)

FOREIGN PATENT DOCUMENTS

CN    201898432 U    7/2011
CN    103687443 A    3/2014
(Continued)

OTHER PUBLICATIONS

Office Action with regard to the counterpart U.S. Appl. No. 17/697,264 mailed Nov. 22, 2023.
(Continued)

*Primary Examiner* — Mandeep S Buttar
(74) *Attorney, Agent, or Firm* — BCF LLP

(57) ABSTRACT

A rack system for housing an electronic device comprising: an immersion case configured to provide housing to the electronic device, and to receive an immersion cooling liquid, wherein the immersion case includes a drainage opening, wherein the drainage opening is configured to remove at least a part of the immersion cooling liquid from the immersion case, based on a user actuated action, during a de-racking operation of the immersion case; and a rack frame configured to slidably accommodate racking and de-racking operations of the immersion case.

20 Claims, 9 Drawing Sheets

(51) Int. Cl.
  *F28F 3/02* (2006.01)
  *G06F 1/20* (2006.01)
  *H01L 23/44* (2006.01)
  *H01L 23/473* (2006.01)
  *H05K 7/14* (2006.01)

(52) U.S. Cl.
  CPC .............. *G06F 1/20* (2013.01); *G06F 1/206* (2013.01); *H01L 23/44* (2013.01); *H01L 23/473* (2013.01); *H05K 7/1488* (2013.01); *H05K 7/1489* (2013.01); *H05K 7/20245* (2013.01); *H05K 7/20254* (2013.01); *H05K 7/20263* (2013.01); *H05K 7/20272* (2013.01); *H05K 7/203* (2013.01); *H05K 7/20327* (2013.01); *H05K 7/20336* (2013.01); *H05K 7/20763* (2013.01); *H05K 7/20772* (2013.01); *H05K 7/20781* (2013.01); *H05K 7/20809* (2013.01); *H05K 7/20818* (2013.01); *F28D 2021/0029* (2013.01); *G06F 2200/201* (2013.01)

(58) Field of Classification Search
  CPC ........... H05K 7/20818; H05K 7/20318; H05K 7/20272; H05K 7/20327; H05K 5/067; H05K 7/20309; H05K 7/208; G06F 1/20; G06F 2200/201; G06F 1/181; F28D 2021/0028
  USPC ....................................................... 361/699
  See application file for complete search history.

(56) References Cited

U.S. PATENT DOCUMENTS

| | | |
|---|---|---|
| 3,938,689 A | 2/1976 | De Munnik |
| 4,279,966 A | 7/1981 | Wakana et al. |
| 4,619,316 A | 10/1986 | Nakayama et al. |
| 4,888,664 A | 12/1989 | Rojc |
| 5,268,814 A | 12/1993 | Yakubowski |
| 5,307,956 A | 5/1994 | Richter et al. |
| 5,669,524 A | 9/1997 | Loedel |
| 5,907,473 A | 5/1999 | Przilas et al. |
| 6,023,934 A | 2/2000 | Gold |
| 6,746,388 B2 | 6/2004 | Edwards et al. |
| 6,847,525 B1 | 1/2005 | Smith et al. |
| 6,883,593 B2 | 4/2005 | Johnson et al. |
| 6,899,164 B1 | 5/2005 | Li et al. |
| 7,369,410 B2 | 5/2008 | Chen et al. |
| 7,403,392 B2 | 7/2008 | Attlesey et al. |
| 7,414,845 B2 | 8/2008 | Attlesey et al. |
| 7,527,085 B2 | 5/2009 | Iijima et al. |
| 7,724,517 B2 | 5/2010 | Attlesey et al. |
| 7,885,070 B2 | 2/2011 | Campbell et al. |
| 7,900,796 B2 | 3/2011 | Ungrady et al. |
| 7,905,106 B2 | 3/2011 | Attlesey |
| 7,911,782 B2 | 3/2011 | Attlesey et al. |
| 7,911,793 B2 | 3/2011 | Attlesey |
| 8,009,419 B2 | 8/2011 | Attlesey et al. |
| 8,014,150 B2 | 9/2011 | Campbell et al. |
| 8,089,764 B2 | 1/2012 | Attlesey |
| 8,089,765 B2 | 1/2012 | Attlesey |
| 8,089,766 B2 | 1/2012 | Attlesey |
| 8,291,964 B2 | 10/2012 | Hwang et al. |
| 8,305,759 B2 * | 11/2012 | Attlesey ............. H05K 7/20772 165/80.4 |
| 8,467,189 B2 | 6/2013 | Attlesey |
| 8,619,425 B2 | 12/2013 | Campbell et al. |
| 8,654,529 B2 | 2/2014 | Tufty et al. |
| 8,934,244 B2 | 1/2015 | Shelnutt et al. |
| 8,953,317 B2 | 2/2015 | Campbell et al. |
| 9,049,800 B2 | 6/2015 | Shelnutt et al. |
| 9,051,502 B2 | 6/2015 | Sedarous et al. |
| 9,086,859 B2 | 7/2015 | Tufty et al. |
| 9,128,681 B2 | 9/2015 | Tufty et al. |
| 9,144,179 B2 | 9/2015 | Shelnutt et al. |
| 9,155,230 B2 | 10/2015 | Eriksen |
| 9,176,547 B2 | 11/2015 | Tufty et al. |
| 9,195,282 B2 | 11/2015 | Shelnutt et al. |
| 9,223,360 B2 | 12/2015 | Tufty et al. |
| 9,328,964 B2 | 5/2016 | Shelnutt et al. |
| 9,335,802 B2 | 5/2016 | Shelnutt et al. |
| 9,351,429 B2 | 5/2016 | Shelnutt et al. |
| 9,382,914 B1 | 7/2016 | Sharfi |
| 9,426,927 B2 | 8/2016 | Shafer et al. |
| 9,436,235 B2 | 9/2016 | Damaraju et al. |
| 9,464,854 B2 | 10/2016 | Shelnutt et al. |
| 9,529,395 B2 | 12/2016 | Franz et al. |
| 9,699,938 B2 | 7/2017 | Shelnutt et al. |
| 9,699,939 B2 | 7/2017 | Smith |
| 9,717,166 B2 | 7/2017 | Eriksen |
| 9,756,766 B2 | 9/2017 | Best |
| 9,773,526 B2 | 9/2017 | Shelnutt et al. |
| 9,781,859 B1 | 10/2017 | Wishman et al. |
| 9,795,065 B2 | 10/2017 | Shelnutt et al. |
| 9,839,164 B2 | 12/2017 | Shelnutt et al. |
| 9,844,166 B2 | 12/2017 | Shelnutt et al. |
| 9,921,622 B2 | 3/2018 | Shelnutt et al. |
| 9,968,010 B2 | 5/2018 | Shelnutt et al. |
| 9,992,914 B2 | 6/2018 | Best et al. |
| 10,010,013 B2 | 6/2018 | Shelnutt et al. |
| 10,018,425 B2 | 7/2018 | Shelnutt et al. |
| 10,020,242 B2 | 7/2018 | Katsumata et al. |
| 10,064,314 B2 | 8/2018 | Shelnutt et al. |
| 10,104,808 B2 | 10/2018 | Scharinger et al. |
| 10,130,008 B2 | 11/2018 | Shepard et al. |
| 10,143,113 B2 | 11/2018 | Shelnutt et al. |
| 10,143,114 B2 | 11/2018 | Shelnutt et al. |
| 10,146,231 B2 | 12/2018 | Shelnutt et al. |
| 10,149,408 B2 | 12/2018 | Fujiwara et al. |
| 10,156,873 B2 | 12/2018 | Shelnutt et al. |
| 10,172,262 B2 | 1/2019 | Shelnutt et al. |
| 10,206,312 B2 | 2/2019 | Shelnutt et al. |
| 10,212,857 B2 | 2/2019 | Eriksen |
| 10,225,958 B1 | 3/2019 | Gao |
| 10,238,010 B2 | 3/2019 | Shelnutt et al. |
| 10,271,456 B2 | 4/2019 | Tufty et al. |
| 10,321,609 B2 | 6/2019 | Hirai et al. |
| 10,331,144 B2 | 6/2019 | Shelnutt et al. |
| 10,399,190 B2 | 9/2019 | North et al. |
| 10,542,635 B2 | 1/2020 | Nishiyama |
| 10,598,441 B2 | 3/2020 | Kawabata et al. |
| 10,617,042 B2 | 4/2020 | Shelnutt et al. |
| 10,622,283 B2 | 4/2020 | Leobandung |
| 10,624,236 B2 | 4/2020 | Inano et al. |
| 10,624,242 B2 | 4/2020 | Best |
| 10,638,641 B2 | 4/2020 | Franz et al. |
| 10,645,841 B1 * | 5/2020 | Mao ................... H05K 7/20781 |
| 10,653,036 B1 * | 5/2020 | Gao ................... H05K 7/20281 |
| 10,667,434 B1 | 5/2020 | Mao et al. |
| 10,674,641 B2 | 6/2020 | Shepard et al. |
| 10,716,238 B2 | 7/2020 | Brink |
| 10,729,039 B2 | 7/2020 | Shelnutt et al. |
| 10,791,647 B1 | 9/2020 | Miyamura et al. |
| 10,809,011 B2 | 10/2020 | Chu et al. |
| 10,871,807 B2 | 12/2020 | Best et al. |
| 10,888,032 B2 | 1/2021 | Wakino et al. |
| 10,917,998 B2 | 2/2021 | Shelnutt et al. |
| 10,932,390 B2 | 2/2021 | Korikawa |
| 10,939,580 B2 | 3/2021 | Gao |
| 10,939,581 B1 | 3/2021 | Chen et al. |
| 10,990,144 B2 | 4/2021 | Wang et al. |
| 11,006,547 B2 | 5/2021 | Gao |
| 11,032,939 B2 | 6/2021 | Tufty et al. |
| 11,071,238 B2 | 7/2021 | Edmunds et al. |
| 11,107,749 B2 | 8/2021 | Taniguchi et al. |
| 11,268,739 B2 | 3/2022 | Wang et al. |
| 11,572,614 B2 | 2/2023 | Sakamoto et al. |
| 11,751,359 B2 | 9/2023 | Heydari |
| 11,822,398 B2 | 11/2023 | Heydari |
| 2002/0159233 A1 | 10/2002 | Patel et al. |
| 2004/0244947 A1 | 12/2004 | Chen |
| 2005/0150637 A1 | 7/2005 | Tan et al. |
| 2005/0248922 A1 | 11/2005 | Chu et al. |

(56) References Cited

U.S. PATENT DOCUMENTS

| | | |
|---|---|---|
| 2007/0227756 A1 | 10/2007 | Doerr et al. |
| 2009/0146294 A1 | 6/2009 | Hillman et al. |
| 2009/0205590 A1 | 8/2009 | Vetrovec |
| 2009/0260777 A1 | 10/2009 | Attlesey |
| 2010/0103620 A1 | 4/2010 | Campbell et al. |
| 2010/0108292 A1 | 5/2010 | Bhunia et al. |
| 2010/0118494 A1 | 5/2010 | Campbell et al. |
| 2010/0170657 A1 | 7/2010 | Kaslusky |
| 2010/0328889 A1 | 12/2010 | Campbell et al. |
| 2011/0026776 A1 | 2/2011 | Liang et al. |
| 2011/0028617 A1 | 2/2011 | Hill et al. |
| 2011/0267768 A1 | 11/2011 | Attlesey |
| 2011/0284194 A1 | 11/2011 | Sarkar et al. |
| 2011/0286177 A1 | 11/2011 | Attlesey |
| 2011/0317367 A1 | 12/2011 | Campbell et al. |
| 2012/0007579 A1 | 1/2012 | Apblett et al. |
| 2012/0014064 A1 | 1/2012 | St Rock et al. |
| 2012/0058588 A1 | 3/2012 | Mayer et al. |
| 2012/0075797 A1 | 3/2012 | Attlesey |
| 2012/0120599 A1 | 5/2012 | Chua et al. |
| 2012/0193068 A1* | 8/2012 | Nemesh .............. H01M 10/625 165/41 |
| 2013/0105120 A1 | 5/2013 | Campbell et al. |
| 2014/0123492 A1 | 5/2014 | Campbell et al. |
| 2014/0216688 A1* | 8/2014 | Shelnutt .............. F28D 15/0266 165/104.13 |
| 2014/0216711 A1* | 8/2014 | Shelnutt .............. F28D 15/0266 165/104.19 |
| 2014/0218845 A1 | 8/2014 | Peng et al. |
| 2014/0218861 A1 | 8/2014 | Shelnutt et al. |
| 2014/0321054 A1 | 10/2014 | Kaefer et al. |
| 2015/0061568 A1* | 3/2015 | Martinez ................ H02S 20/30 136/246 |
| 2015/0062806 A1* | 3/2015 | Shelnutt ............. H05K 7/20318 361/679.53 |
| 2015/0109730 A1 | 4/2015 | Campbell et al. |
| 2015/0237767 A1 | 8/2015 | Shedd et al. |
| 2015/0330718 A1 | 11/2015 | St Rock et al. |
| 2016/0021793 A1 | 1/2016 | Chen |
| 2016/0120059 A1 | 4/2016 | Shedd et al. |
| 2016/0305565 A1 | 10/2016 | Miller et al. |
| 2016/0330874 A1 | 11/2016 | Sato et al. |
| 2016/0360637 A1 | 12/2016 | Harvilchuck et al. |
| 2016/0366792 A1 | 12/2016 | Smith |
| 2017/0105313 A1 | 4/2017 | Shedd et al. |
| 2017/0127565 A1* | 5/2017 | Campbell .......... H05K 7/20127 |
| 2017/0181328 A1 | 6/2017 | Shelnutt et al. |
| 2017/0241721 A1 | 8/2017 | Liang |
| 2017/0265328 A1 | 9/2017 | Sasaki et al. |
| 2018/0008467 A1 | 1/2018 | Cater et al. |
| 2018/0027695 A1 | 1/2018 | Wakino et al. |
| 2018/0042138 A1 | 2/2018 | Campbell et al. |
| 2018/0070477 A1 | 3/2018 | Saito |
| 2018/0084671 A1* | 3/2018 | Matsumoto ........ H05K 7/20772 |
| 2018/0092243 A1 | 3/2018 | Saito |
| 2018/0153058 A1 | 5/2018 | Hirai et al. |
| 2018/0196484 A1 | 7/2018 | Saito |
| 2018/0246550 A1 | 8/2018 | Inaba et al. |
| 2018/0295745 A1 | 10/2018 | De Meijer et al. |
| 2018/0338388 A1 | 11/2018 | We et al. |
| 2019/0014685 A1 | 1/2019 | So et al. |
| 2019/0090383 A1 | 3/2019 | Tufty et al. |
| 2019/0098796 A1 | 3/2019 | Wakino et al. |
| 2019/0218101 A1 | 7/2019 | Huang et al. |
| 2019/0223324 A1 | 7/2019 | Le et al. |
| 2019/0297747 A1 | 9/2019 | Wakino et al. |
| 2020/0025451 A1 | 1/2020 | Stone et al. |
| 2020/0093037 A1 | 3/2020 | Enright et al. |
| 2020/0095667 A1 | 3/2020 | Sakamoto et al. |
| 2020/0150731 A1 | 5/2020 | Wang et al. |
| 2020/0196489 A1 | 6/2020 | Chang et al. |
| 2020/0214169 A1 | 7/2020 | Tsunoda |
| 2020/0267872 A1 | 8/2020 | Harada et al. |
| 2020/0288600 A1 | 9/2020 | Gao |
| 2020/0305307 A1 | 9/2020 | Amos et al. |
| 2020/0323100 A1 | 10/2020 | Chiu et al. |
| 2020/0323108 A1 | 10/2020 | Bilan et al. |
| 2020/0389998 A1 | 12/2020 | Tung et al. |
| 2020/0390007 A1 | 12/2020 | Edmunds et al. |
| 2021/0051815 A1 | 2/2021 | Van et al. |
| 2021/0076531 A1 | 3/2021 | Tung et al. |
| 2021/0102294 A1 | 4/2021 | Miljkovic et al. |
| 2021/0112683 A1 | 4/2021 | Mohajer et al. |
| 2021/0185850 A1 | 6/2021 | Kulkarni et al. |
| 2021/0321526 A1 | 10/2021 | Kulkarni et al. |
| 2021/0327787 A1 | 10/2021 | Yang et al. |
| 2021/0385971 A1 | 12/2021 | Gorius et al. |
| 2021/0410292 A1 | 12/2021 | Yang et al. |
| 2021/0410319 A1 | 12/2021 | Manousakis et al. |
| 2021/0410320 A1 | 12/2021 | Yang et al. |
| 2021/0410328 A1 | 12/2021 | Yang et al. |
| 2022/0256744 A1 | 8/2022 | Le et al. |
| 2023/0059446 A1* | 2/2023 | Gao ....................... H05K 7/208 |
| 2024/0152163 A1* | 5/2024 | Heger ................... F24H 15/395 |

FOREIGN PATENT DOCUMENTS

| | | |
|---|---|---|
| CN | 106681459 A | 5/2017 |
| CN | 107643813 A | 1/2018 |
| CN | 110691490 A | 1/2020 |
| CN | 210630126 U | 5/2020 |
| CN | 211184672 U | 8/2020 |
| CN | 110430725 B | 2/2021 |
| EP | 2321849 A1 | 5/2011 |
| EP | 2331412 B1 | 9/2012 |
| EP | 3236727 A2 | 10/2017 |
| EP | 3249496 A1 | 11/2017 |
| EP | 3236727 A3 | 1/2018 |
| EP | 3346491 A1 | 7/2018 |
| EP | 3402316 A1 | 11/2018 |
| EP | 3731611 A1 | 10/2020 |
| EP | 3742097 A1 | 11/2020 |
| EP | 2321849 B1 | 1/2022 |
| GB | 2575680 A | 1/2020 |
| GB | 2574632 B | 7/2020 |
| JP | H043451 A | 1/1992 |
| JP | 2000092819 A | 3/2000 |
| JP | 2020065002 A | 4/2020 |
| NL | 1006486 C2 | 1/1999 |
| TW | I 678 961 B | 12/2019 |
| WO | 2011006150 A1 | 1/2011 |
| WO | 2012162986 A1 | 12/2012 |
| WO | 2014/169230 A1 | 10/2014 |
| WO | 2016076882 A1 | 5/2016 |
| WO | 2017/040217 A1 | 3/2017 |
| WO | 2018025016 A1 | 2/2018 |
| WO | 2018054462 A1 | 3/2018 |
| WO | 2019006437 A1 | 1/2019 |
| WO | 2019060576 A2 | 3/2019 |
| WO | 2019068916 A2 | 4/2019 |
| WO | 2019068916 A3 | 6/2019 |
| WO | 2020/102090 A1 | 5/2020 |
| WO | 2020170079 A1 | 8/2020 |
| WO | 2020/183038 A1 | 9/2020 |
| WO | 2020216954 A1 | 10/2020 |
| WO | 2020/234600 A1 | 11/2020 |
| WO | 2020223806 A1 | 11/2020 |
| WO | 2020254917 A1 | 12/2020 |
| WO | 2021/040841 A1 | 3/2021 |
| WO | 2021161026 A1 | 8/2021 |

OTHER PUBLICATIONS

Office Action with regard to the counterpart U.S. Appl. No. 17/697,452 mailed Nov. 22, 2023.

Office Action with regard to the counterpart U.S. Appl. No. 17/697,452 mailed May 11, 2023.

Office Action with regard to the counterpart U.S. Appl. No. 17/694,765 mailed Dec. 21, 2023.

Notice of Allowance with regard to the counterpart U.S. Appl. No. 17/691,494 mailed Apr. 17, 2023.

(56) References Cited

OTHER PUBLICATIONS

International Search Report and Written Opinion with regard to PCTIB2022053071 mailed Jun. 28, 2022.
International Search Report and Written Opinion with regard to PCT/IB2022/052975 mailed Jun. 20, 2022.
International Search Report and Written Opinion with regard to PCTIB2022052330 mailed May 30, 2022.
International Search Report and Written Opinion with regard to PCT/IB2022/052976 mailed Jun. 17, 2022.
International Search Report and Written Opinion with regard to PCT/IB2022/052977 mailed Jun. 20, 2022.
European Search Report with regard to EP21306170.8 completed Feb. 12, 2022.
European Search Report with regard to EP21306189.8 completed Feb. 10, 2022.
Office Action with regard to the counterpart U.S. Appl. No. 17/698,480 mailed Sep. 7, 2023.
Office Action with regard to the counterpart U.S. Appl. No. 17/701,422 mailed Mar. 28, 2023.
Extended European Search Report with regard to the counterpart EP Patent Application No. 22305018.8 completed Jun. 24, 2022.
"HP Expands Workstation Series to Include Desk-side, Mobile and Small Form Factor Mode", TechPowerUp, Mar. 24, 2010, https://www.techpowerup.com/118323/hp-expands-workstation-series-to-include-desk-side-mobile-and-small-form-factor-mode, retrieved on Jul. 19, 2021, 6 pages.
"IBM's Hot-Water Supercomputer Goes Live", Data Center Knowledge, retrieved on Jul. 19, 2021, 9 pages.
Extended European Search Report with regard to the EP Patent Application No. 21306771.3 completed May 23, 2022.
Extended European Search Report with regard to the EP Patent Application No. 21306173.2 completed Feb. 18, 2022.
Extended European Search Report with regard to the EP Patent Application No. 21306174.0 completed Feb. 14, 2022.
Extended European Search Report with regard to the EP Patent Application No. 21306172.4 completed Feb. 15, 2022.
English Abstract for JP2020065002 retrieved on Espacenet on Jun. 2, 2022.
Extended European Search Report with regard to the EP Patent Application No. 21306186.4 completed Feb. 10, 2022.
Extended European Search Report with regard to the EP Patent Application No. 21306187.2 completed Feb. 10, 2022.
Extended European Search Report with regard to the EP Patent Application No. 21306175.7 completed Apr. 8, 2022.
Extended European Search Report with regard to the EP Patent Application No. 21306188.0 completed Feb. 10, 2022.
English Abstract for JPH043451 retrieved on Feb. 22, 2022.
Extended European Search Report with regard to the EP Patent Application No. 21306171.6 completed Feb. 11, 2022.
Extended European Search Report with regard to the EP Patent Application No. 21306189.8 completed Feb. 10, 2022.
Extended European Search Report with regard to the EP Patent Application No. 21306170.8 completed Feb. 12, 2022.
English Abstract for NL1006486 retrieved on Espacenet on Jun. 3, 2022.
Office Action with regard to te counterpart U.S. Appl. No. 17/690,839 issued Jun. 25, 2024.
Office Action with regard to te counterpart U.S. Appl. No. 17/698,480 issued Jul. 3, 2024.
Office Action with regard to te counterpart CN Patent Application No. 2022103375051 issued May 11, 2024.
Notice of Allowance with regard to the counterpart U.S. Appl. No. 17/690,839 mailed Mar. 5, 2024.
Office Action with regard to the counterpart U.S. Appl. No. 17/698,037 mailed Feb. 26, 2024.
Office Action with regard to te counterpart CN Patent Application No. 2022103326074 issued Jul. 29, 2024.
Notice of Allowance with regard to the counterpart U.S. Appl. No. 17/707,200 issued Aug. 15, 2024.
Office Action with regard to the counterpart CN Patent Application No. 2022103375314 issued Aug. 12, 2024.
Office Action with regard to the counterpart CN Patent Application No. 2022103478109 issued Aug. 30, 2024.
Office Action with regard to the counterpart U.S. Appl. No. 17/697,452 issued Sep. 6, 2024.

* cited by examiner

RACK SYSTEM FOR HOUSING AN ELECTRONIC DEVICE

CROSS-REFERENCE TO RELATED APPLICATIONS

The present patent application claims priority from European Patent Application Number 21305427.3, filed on Apr. 1, 2021, and from European Patent Application Number 21306187.2, filed on Aug. 31, 2021, the disclosure of which is incorporated by reference herein in their entirety.

TECHNICAL FIELD

The present disclosure generally relates to a rack system and, in particular, to a rack system for housing an electronic device.

BACKGROUND

Electronic devices, for example servers, memory banks, computer discs, and the like, are conventionally grouped in rack structures. Large data centers and other large computing infrastructures may contain thousands of rack structures supporting thousands or even tens of thousands of electronic devices.

The electronic devices mounted in the rack structures consume a large amount of electric power and generate a significant amount of heat. Cooling needs are important in such rack structures. Some electronic devices, such as processors, generate so much heat that they could fail within seconds in case of a lack of cooling.

Forced air-cooling has been traditionally used to disperse heat generated by the electronic devices mounted in the rack structures. Air-cooling requires the use of powerful fans, the provision of space between the electronic devices for placing heat sinks and for allowing sufficient airflow, and is generally not very efficient.

With further advancements, liquid-cooling technologies, for example using water-cooling, immersion cooling technologies, for example using water and dielectric immersion cooling liquid, are increasingly used to as an efficient and cost-effective solution to preserve safe operating temperatures of the electronic devices mounted in the rack structures.

However, it is to be noted that, for using the immersion cooling technologies, the dielectric immersion cooling liquid to be filled in an immersion case that provides housing to the electronic devices in the rack structure. It is to be noted that typically a good quality dielectric immersion cooling liquid is quite expensive. There are chances that while de-racking the immersion case from the rack structure, the dielectric immersion cooling liquid may spill out of the immersion rack and at least some portion of the dielectric immersion cooling liquid may get wasted in the de-racking process. In addition to the economic loss, spilling dielectric immersion cooling liquid situations may also be detrimental to the environment.

With this said, there is an interest in designing an effective immersion cases for the rack structure that reduces the above-mentioned problem.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

The embodiments of the present disclosure have been developed based on developers' appreciation of the shortcomings associated with the prior art.

In particular such shortcomings may comprise spilling out of the immersion cooling liquid from an immersion case during the de-racking operation of immersion case from a rack structure.

To do so, developers of the present disclosure have devised an immersion case with a drainage opening, such that prior to de-racking the immersion case from the rack structure, the drainage opening may allow a removal of at least a part of the immersion cooling liquid from the vertically installed immersion case in rack structure.

In accordance with a broad aspect of the present disclosure, there is provided a rack system for housing an electronic device, comprising: an immersion case configured to provide housing to the electronic device, and to receive an immersion cooling liquid, wherein the immersion case includes a drainage opening, wherein the drainage opening is configured to remove at least a part of the immersion cooling liquid from the immersion case, based on a user actuated action, during a de-racking operation of the immersion case; and a rack frame configured to slidably accommodate racking and de-racking operations of the immersion case.

In accordance with some embodiments of the present disclosure, the rack system, wherein the drainage opening is a liquid-proof closing configured to be openable and closable such that, when the liquid-proof openable closing is opened, based on the user actuated action, the liquid-proof closing allows removal of at least a part of the immersion cooling liquid from the immersion case during the de-racking operation.

In accordance with some embodiments of the present disclosure, the rack system, wherein the drainage opening further comprises one or more of a valve and a pump to remove at least a part of the immersion cooling liquid.

In accordance with some embodiments of the present disclosure, the rack system, wherein the immersion case is coupled to a pivot pin.

In accordance with some embodiments of the present disclosure, the rack system, wherein the immersion case is further configured to pivot about a pivot axis associated with the pivot pin in such a manner that the drainage opening allows removal of at least a part of the immersion cooling liquid from the immersion case during the de-racking operation.

In accordance with some embodiments of the present disclosure, the rack system, wherein the immersion case is manually pivotable about the pivot axis.

In accordance with some embodiments of the present disclosure, the rack system, wherein the immersion case is mechanically pivotable about the pivot axis.

In accordance with some embodiments of the present disclosure, the rack system, wherein the pivot pin is coupled to a pedal and the pedal causes the immersion case to mechanically pivot about the pivot axis.

In accordance with some embodiments of the present disclosure, the rack system, wherein the immersion case is pneumatically pivotable about the pivot axis.

In accordance with some embodiments of the present disclosure, the rack system, wherein the pivot pin is coupled at a pneumatic cushion and the pneumatic cushion causes the immersion case to pneumatically pivot about the pivot axis.

In accordance with some embodiments of the present disclosure, the rack system, wherein the immersion case is configured to pivot between 0 to 45 degrees about the pivot axis.

In accordance with some embodiments of the present disclosure, the rack system, wherein the immersion case further includes a sensor configured to determine and indicate a level of the immersion cooling liquid in the immersion case.

In accordance with some embodiments of the present disclosure, the rack system, wherein the user actuated action is associated with pivoting the immersion case about the pivot axis.

In accordance with some embodiments of the present disclosure, the rack system, wherein the immersion cooling liquid is a dielectric immersion cooling liquid.

In accordance with some embodiments of the present disclosure, the rack system, wherein the immersion case is stacked vertically in the rack frame.

In accordance with some embodiments of the present disclosure, the rack system, wherein the serpentine convection coil is fluidly coupled to liquid coolant inlet/outlet conduits to facilitate a flow of circulating cooling liquid within the serpentine convection coil.

In accordance with some embodiments of the present disclosure, the rack system, wherein the immersion case further comprises a serpentine convection coil configured to cool the immersion cooling liquid.

In accordance with some embodiments of the present disclosure, the rack system, wherein the immersion case further comprises a detachable frame configured to hold the electronic device.

In accordance with some embodiments of the present disclosure, the rack system, wherein the electronic device is one or more of: a computing device, a server and a power system.

In accordance with some embodiments of the present disclosure, the rack system, wherein the circulating cooling liquid is water.

In accordance with some embodiments of the present disclosure, the rack system, wherein the immersion case is constructed from aluminum In accordance with some embodiments of the present disclosure, the rack system, wherein the immersion case includes a plurality of immersion cases.

In accordance with some embodiments of the present disclosure, the rack system, wherein the plurality of immersion cases are stacked vertically and arranged in parallel in the rack frame.

BRIEF DESCRIPTION OF THE FIGURES

Further features and advantages of the present disclosure will become apparent from the following detailed description, taken in combination with the appended drawings, in which.

Figure 1:
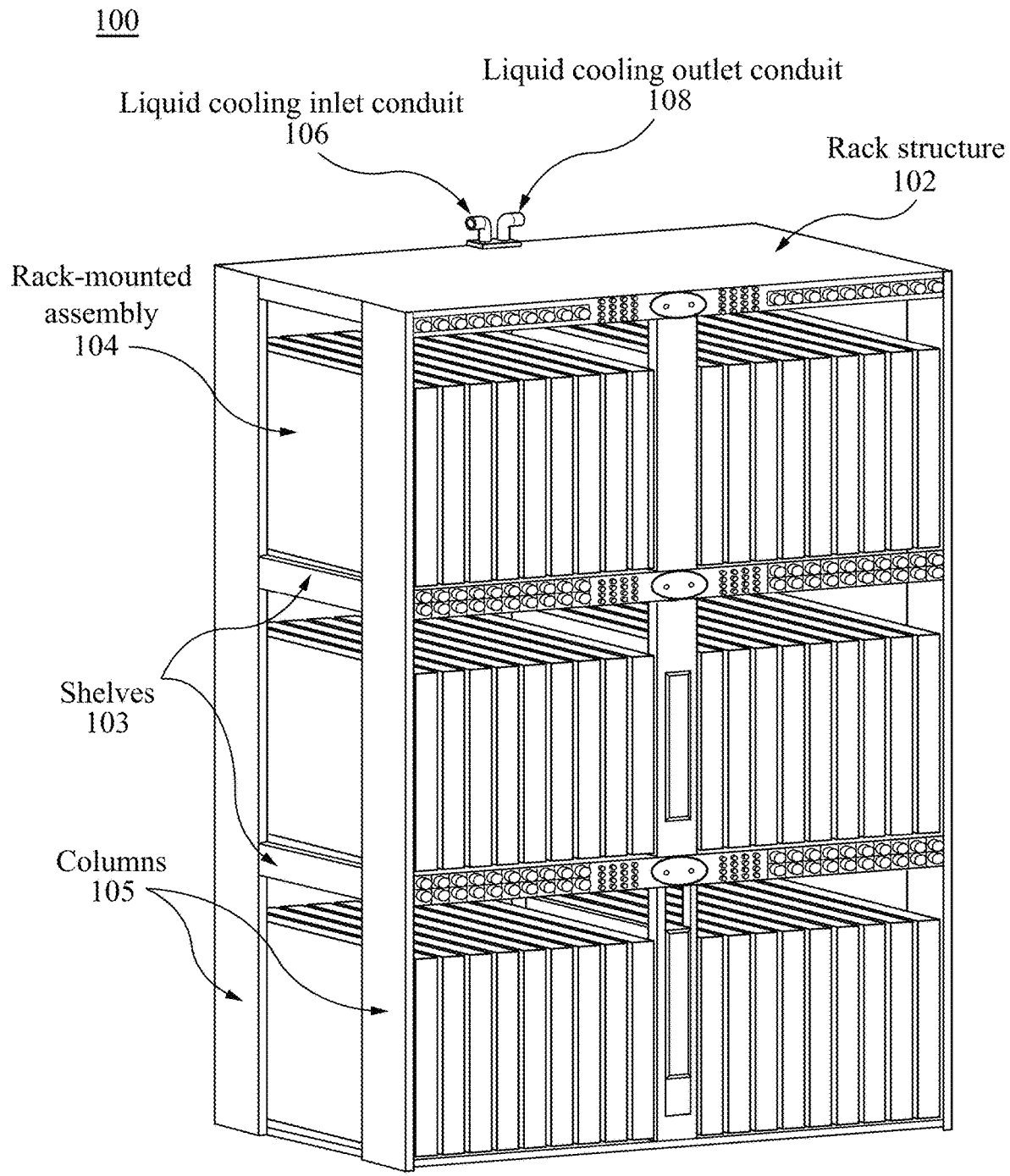
FIG. 1 illustrates a perspective view of a rack system for housing rack mounted assembly, in accordance with various non-limiting embodiments of the present disclosure.

It is to be understood that throughout the appended drawings and corresponding descriptions, like features are identified by like reference characters. Furthermore, it is also to be understood that the drawings and ensuing descriptions are intended for illustrative purposes only and that such disclosures do not provide a limitation on the scope of the claims. The various drawings are not to scale.

DETAILED DESCRIPTION

The instant disclosure is directed to address at least some of the deficiencies of the current technology. In particular, the instant disclosure describes a rack system for housing an electronic device.

Unless otherwise defined or indicated by context, all technical and scientific terms used herein have the same meaning as commonly understood by one of ordinary skill in the art to which the described embodiments appertain to.

In the context of the present specification, unless provided expressly otherwise, the words "first", "second", "third", etc. have been used as adjectives only for the purpose of allowing for distinction between the nouns that they modify from one another, and not for the purpose of describing any particular relationship between those nouns. Thus, for example, it should be understood that, the use of the terms "first processor" and "third processor" is not intended to imply any particular order, type, chronology, hierarchy or ranking (for example) of/between the server, nor is their use (by itself) intended to imply that any "second server" must necessarily exist in any given situation. Further, as is discussed herein in other contexts, reference to a "first" element and a "second" element does not preclude the two elements from being the same actual real-world element. Thus, for example, in some instances, a "first" server and a "second" server may be the same software and/or hardware, in other cases they may be different software and/or hardware.

It will be understood that when an element is referred to as being "connected" or "coupled" to another element, it can be directly or indirectly connected or coupled to the other element or intervening elements that may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In the context of the present specification, when an element is referred to as being "associated with" another element, in certain embodiments, the two elements can be directly or indirectly linked, related, connected, coupled, the second element employs the first element, or the like without limiting the scope of present disclosure.

The terminology used herein is only intended to describe particular representative embodiments and is not intended to be limiting of the present technology. As used herein, the singular forms "a," "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Implementations of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

The examples and conditional language recited herein are principally intended to aid the reader in understanding the principles of the present technology and not to limit its scope to such specifically recited examples and conditions. It will be appreciated that those skilled in the art may devise various arrangements which, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudo-code, and the like represent various processes which may be substantially represented in computer-readable media and so executed by a computer or processor, whether or not such computer or processor is explicitly shown.

In the context of the present specification, when an element is referred to as an electronic device, the element may include but is not limited to: servers including blade servers; disk arrays/storage systems; storage area networks; network attached storage; storage communication systems; work stations; routers; telecommunication infrastructure/switches; wired, optical and wireless communication devices; cell processor devices; printers; power supplies; displays; optical devices; instrumentation systems including hand-held systems; military electronics; etc. Many of the concepts will be described and illustrated herein as applied to an array of computer servers. However, it is to be realized that the concepts described herein could be used on other electronic devices as well.

With these fundamentals in place, the instant disclosure is directed to address at least some of the deficiencies of the current technology. In particular, the instant disclosure describes a rack system for housing an electronic device.

FIG. 1 illustrates a perspective view of a rack system 100 for housing a rack mounted assembly 104, in accordance with various non-limiting embodiments of the present disclosure. As shown, the rack system 100 may include a rack structure 102, a rack mounted assembly 104, a liquid cooling inlet conduit 106 and a liquid cooling outlet conduit 108.

Figure 2:
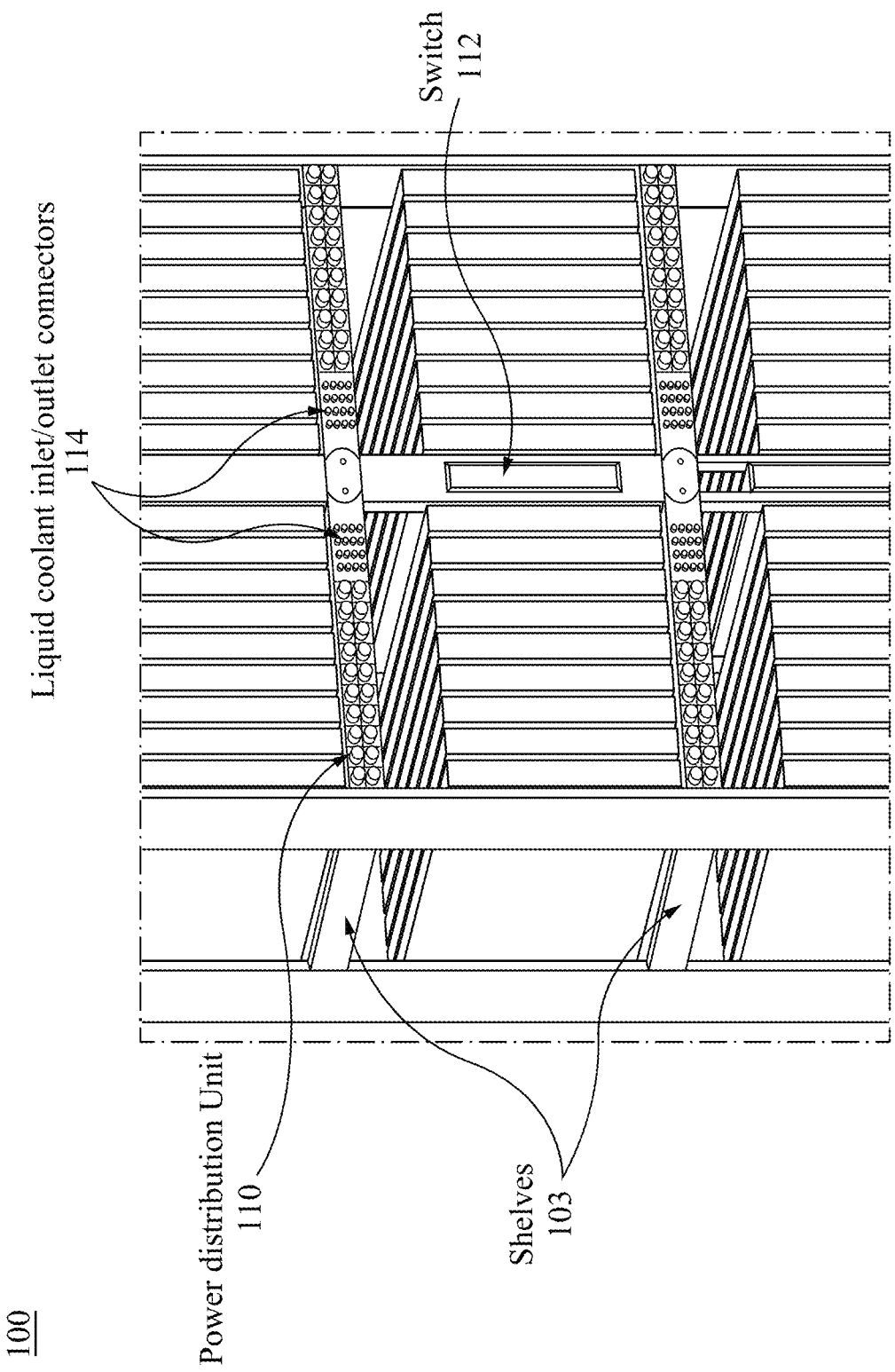
FIG. 2 illustrates another perspective view of the rack system, in accordance with various non-limiting embodiments of the present disclosure.

FIG. 2 illustrates another perspective view of the rack system 100, in accordance with various non-limiting embodiments of the present disclosure. As shown, the rack system 100 may further comprise a power distribution unit 110, a switch 112, and liquid coolant inlet/outlet connectors 114. It is to be noted that the rack system 100 may include other components such as heat exchangers, cables, pumps or the like, however, such components have been omitted from FIGS. 1 and 2 for the purpose of simplicity. As shown in FIGS. 1 and 2, the rack structure 102 may include shelves 103 to slidably accommodate racking and de-racking of one or more rack-mounted assemblies 104. In certain non-limiting embodiments, the one or more rack mounted assemblies 104 may be racked vertically on the shelves 103.

Figure 3:
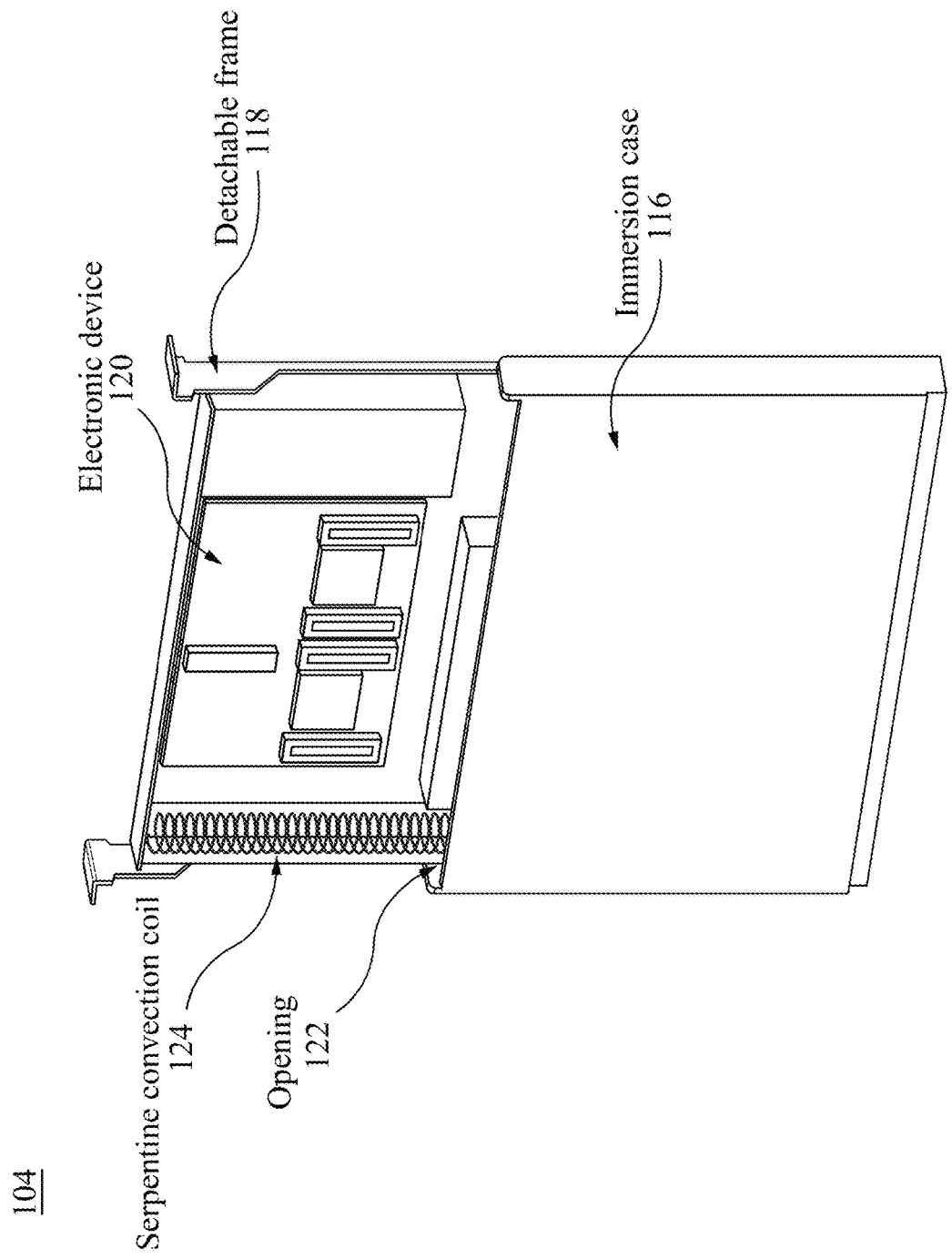
FIG. 3 illustrates a perspective view of the rack mounted assembly, in accordance with various non-limiting embodiments of the present disclosure.

FIG. 3 illustrates a perspective view of the rack mounted assembly 104, in accordance with various non-limiting embodiments of the present disclosure. As shown, the rack mounted assembly 104 may include an immersion case 116 and a detachable frame 118. The detachable frame 118 may hold an electronic device 120 and may be immersed in the immersion case 116.

It is contemplated that the electronic device 120 may generate a significant amount of heat. To this end, the rack system 100 may use a mechanism to cool down the electronic device 120 to prevent the electronic device 120 from getting damaged. To do so, in certain non-limiting embodiments, an immersion cooling liquid may be inserted in the immersion case 116. Further, the detachable frame 118 including the electronic device 120 may be immersed in the immersion case 116. In certain non-limiting embodiments, the immersion cooling liquid and the detachable frame 118 may be inserted to the immersion case 116 via an opening 122 at the top of the immersion case 116. In certain non-limiting embodiments, the detachable frame 118 may be attached in a non-sealed configuration to the immersion case 116.

In certain non-limiting embodiments, the immersion cooling liquid may be dielectric immersion cooling liquid. All the electronic and thermally active components associated with the electronic device 120 may be immersed in the dielectric immersion cooling liquid. The dielectric cooling liquid may be in direct contact with the electronic and thermally active components associated with the electronic device 120. Thus, the immersion case 116 may act as a container containing the electronic device 120 and the dielectric immersion cooling liquid. The dielectric immersion cooling liquid may cool the electronic device 120.

The dielectric immersion cooling liquid that may be used in various embodiments may include but are not limited to Fluorinert™ FC-3283, Fluorinert™ FC-43, Silicone oil 20, Silicone oil 50, Sobyean oil, S5 X (Shell), SmartCoolant (Submer), ThermaSafe R™ (Engineered fluids), Novec™-7100 or the like. It is to be noted that any suitable dielectric immersion cooling may be employed in various non-limiting embodiments, provided the dielectric immersion cooling liquid is capable of providing insulation among various electronic and thermally active components associated with the electronic device 120 along with a capability of cooling the components.

In certain non-limiting embodiments, the immersion case 116 may also include a convection inducing structure to cool/induce convection in the dielectric immersion cooling liquid. By way of a non-limiting example, the convection inducing structure may be a serpentine convection coil 124 attached to the detachable frame 118. The serpentine convection coil 124 may be fluidly coupled to the liquid cooling inlet conduit 106 and the liquid cooling outlet conduit 108 via the liquid coolant inlet/outlet connectors 114. The serpentine convection coil 124 may allow a flow of a circulating cooling liquid. The circulating cooling liquid, by means of convection, may cool down the dielectric immersion cooling system. Thereby, making the cooling mechanism of the electronic device 120 a hybrid cooling mechanism.

Further, the electronic device 120 may be connected to the power distribution unit 110 and the switch 112 via power and network cables (not illustrated) to facilitate powering the electronic device 120 and to facilitate communication between the electronic device 120 and external devices (not illustrated) through the switch 112.

As previously noted that the dielectric immersion cooling liquid may be inserted in the immersion case 116 for cooling the electronic device 120 and the immersion case 116 may be vertically racked in the rack structure 102. There may be instances where the immersion case 116 is removed from the rack structure 102, for example for maintenance purposes. To this end there are chances that the dielectric immersion cooling liquid may be spilled out of the immersion case 116 causing a wastage of at least a part of the dielectric immersion cooling liquid. This may result in a monetary loss as the dielectric immersion cooling liquid is quite expensive to procure and use, with possible negative environmental consequences.

With this said, there is interest in designing an effective immersion cases for the rack structure 102 that may allow a removal of at least a part of the dielectric immersion cooling liquid while preventing the dielectric immersion cooling liquid from spilling out of the immersion case 116. In certain non-limiting embodiments, the removed dielectric immersion cooling liquid may be reused by returned to the immersion case 116 during a racking operation of the immersion case 116 to the rack structure 102.

Figure 4:
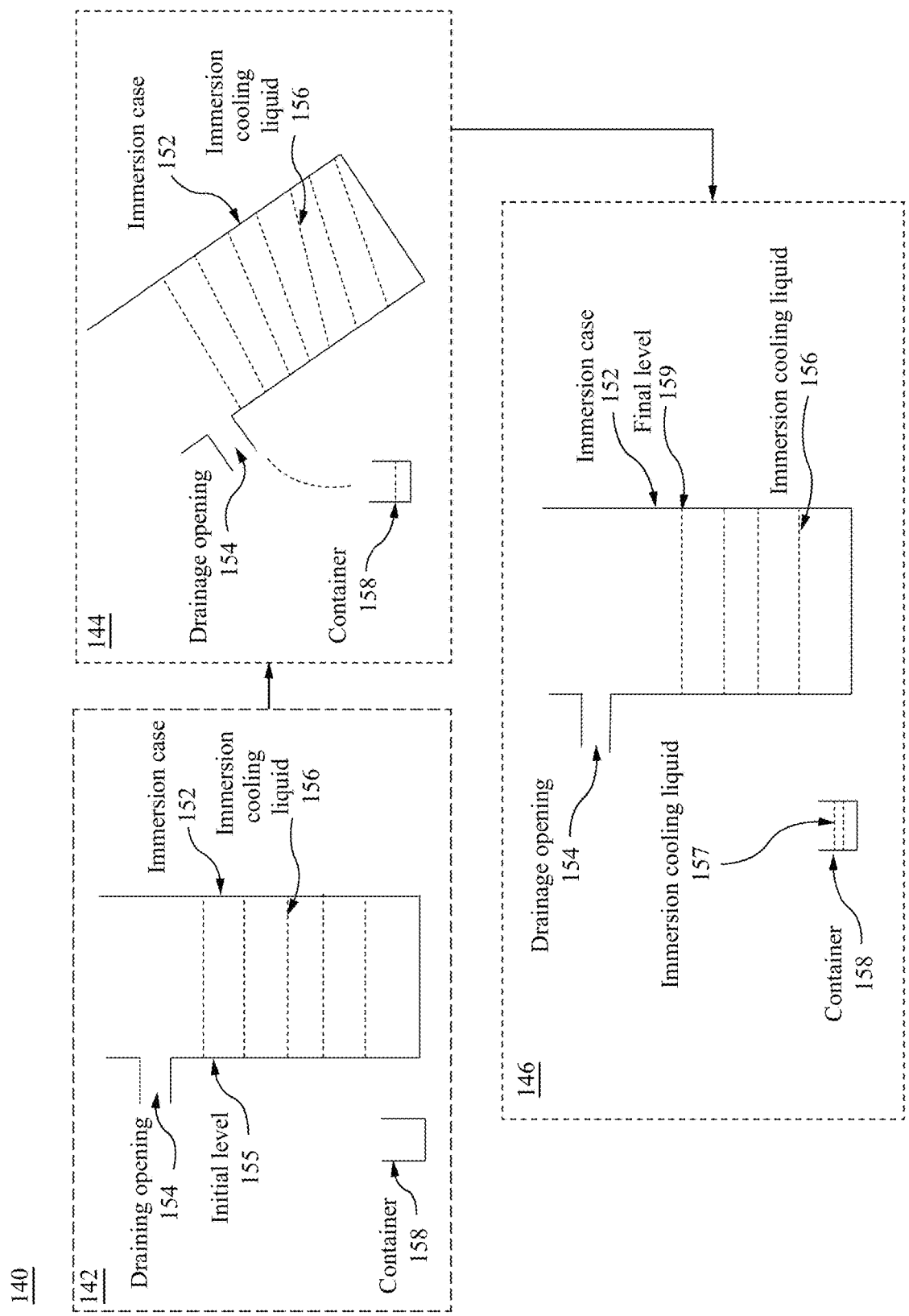
FIG. 4 illustrates a process for removing at least a part of a dielectric immersion cooling liquid from an immersion case, in accordance with various non-limiting embodiments of the present disclosure.

FIG. 4 illustrates a process 140 for removing at least a part of a dielectric immersion cooling liquid 156 from an immersion case 152, in accordance with various non-limiting embodiments of the present disclosure. As shown, the process 140 commences at operation 142 where a container 158 is placed near the immersion case 152 including the dielectric immersion cooling liquid 156 and the electronic device 120 (shown on FIG. 3). The dielectric immersion cooling liquid 156 may have an initial level 155 in the immersion case 152. Further, the immersion case 152 may already be racked in the rack structure 102. In certain non-liming embodiments, the immersion case 152 may include a drainage opening 154.

The process 140 may proceed to the operation 144 where, based on a user actuated action, the drainage opening 154 removes at least a part of the dielectric immersion cooling liquid 156 during the de-racking operation of the immersion case 152 from the rack structure 102. In certain non-limiting embodiments, the de-racking operation may be understood as including a plurality of operations including, for example and limitation, sliding of the immersion case 152, pivoting of the immersion case 152, removal of the immersion case 152 from the rack structure 102.

As a result of the user actuated action (details of which will be discussed later in the disclosure), the immersion case 152 may pivot (e.g., tilt, rotate or move) in such a manner that some of the dielectric immersion cooling liquid 156 may be drained out from the drainage opening 154 and may be collected in the container 158.

The process 140 may proceed to operation 146 where, a level of the dielectric immersion cooling liquid 156 in the immersion case 152 being now lower than in operation 142 and is represented as final level 159. The immersion case 152 may be brought back to original orientation and may be de-racked from the rack structure 102 without spilling out the dielectric immersion cooling liquid 156. The container 158 may contain dielectric immersion cooling liquid 157 removed from the immersion case 152. In certain non-limiting embodiments, the dielectric immersion cooling liquid 157 may be returned to the immersion case 152 during the racking operation.

In certain non-liming embodiments, the immersion case 152 may be open from the top from where the dielectric immersion cooling liquid 156, 157 and the detachable frame 118 holding the electronic device 120 may be inserted in the immersion case.

FIGS. 5-9 illustrate perspective views of various non-limiting embodiments corresponding to the removal of dielectric immersion cooling liquid 204 from an immersion case 200 during the de-racking of the immersion case 200 from the rack structure 102.

Prior to discussing the various non-limiting embodiments as represented by FIGS. 5-9, it is to be noted that the immersion case 152 and the dielectric immersion cooling liquid 156 and 157 previously discussed in FIG. 4 may be similar to the immersion case 200 and the dielectric immersion cooling liquid 204. However, for the purpose of simplicity, the immersion case 200 and the dielectric immersion cooling liquid 204 have been referred with different numerals.

Figure 5:
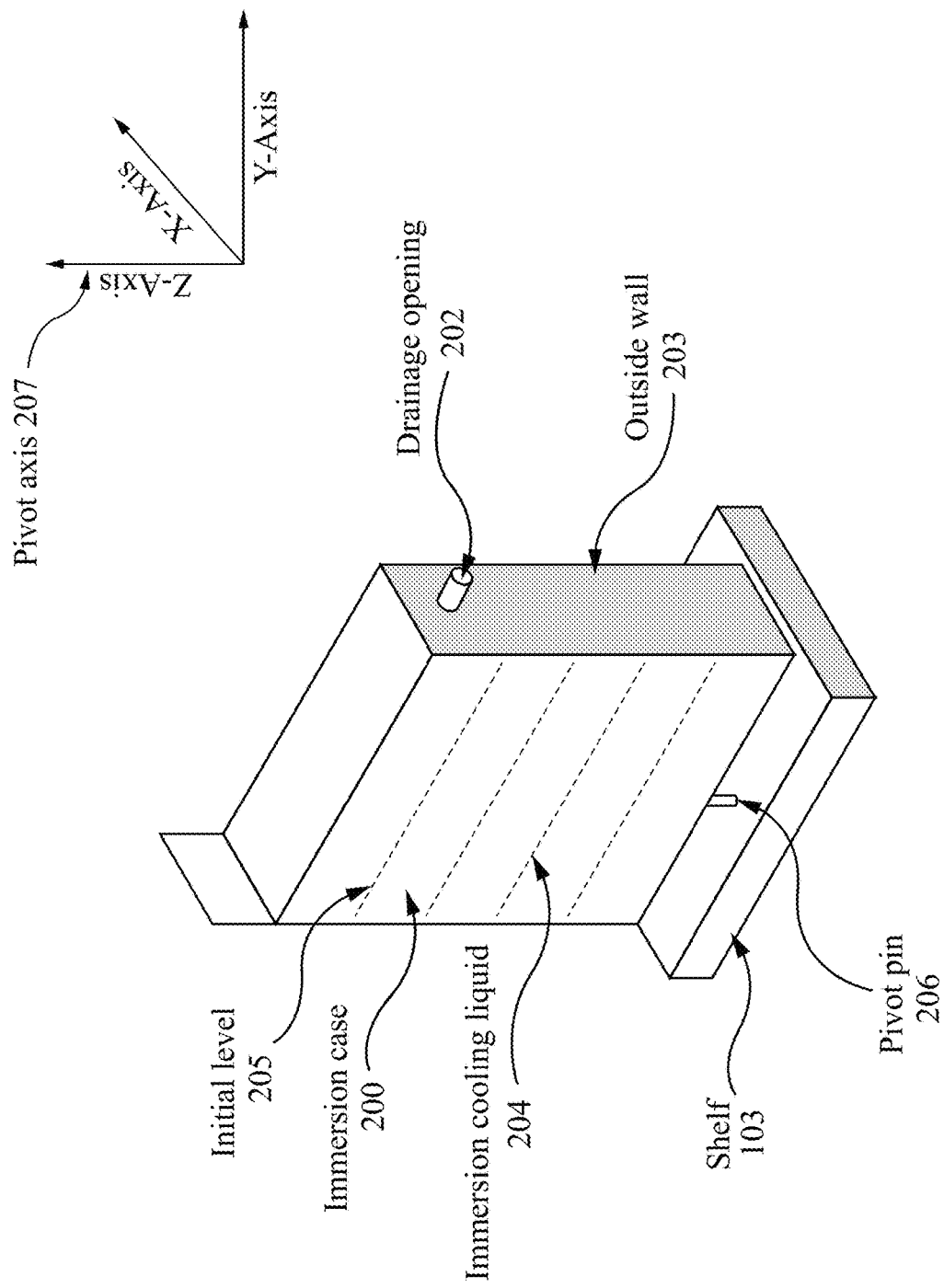
FIGS. 5-9 illustrate perspective views of various non-limiting embodiments corresponding to the removal of dielectric immersion cooling liquid from an immersion case prior to de-racking of the immersion case from the rack structure.

Referring to FIG. 5, in certain non-limiting embodiments, the immersion case 200 may include the dielectric immersion cooling liquid 204 and the electronic device 120 (shown on FIG. 3). The immersion case 200 may include a drainage opening 202. In certain non-limiting embodiments, the drainage opening 202 may be located near the top of an outside wall 203 of immersion case 200, the outside wall 203 being exposed on the front side of the rack structure 102. In certain non-liming embodiments, the drainage opening 202 may be located near the middle of the outside wall 203 of immersion case 200. In other non-limiting embodiments, the drainage opening 202 may be located in near the bottom of the outside wall 203 of immersion case 200. It is to be noted that embodiments where the drainage opening 202 is located on the outside wall 203 of the immersion case 200 do not limit the scope or present disclosure.

In certain non-limiting embodiments, the immersion case 200 may be removably coupled to a pivot pin 206. In certain non-limiting embodiments, the pivot pin 206 may be embedded in the shelf 103 of the rack structure 102. The pivot pin 206 may have a pivot axis 207, the pivot axis 207 being generally oriented along a vertical aspect of the rack structure 102. It is to be noted that the pivot pin is an example of a device for pivoting the immersion case, as other mechanisms for allowing the immersion case 200 to pivot about the pivot axis 207 are also contemplated.

Figure 6:
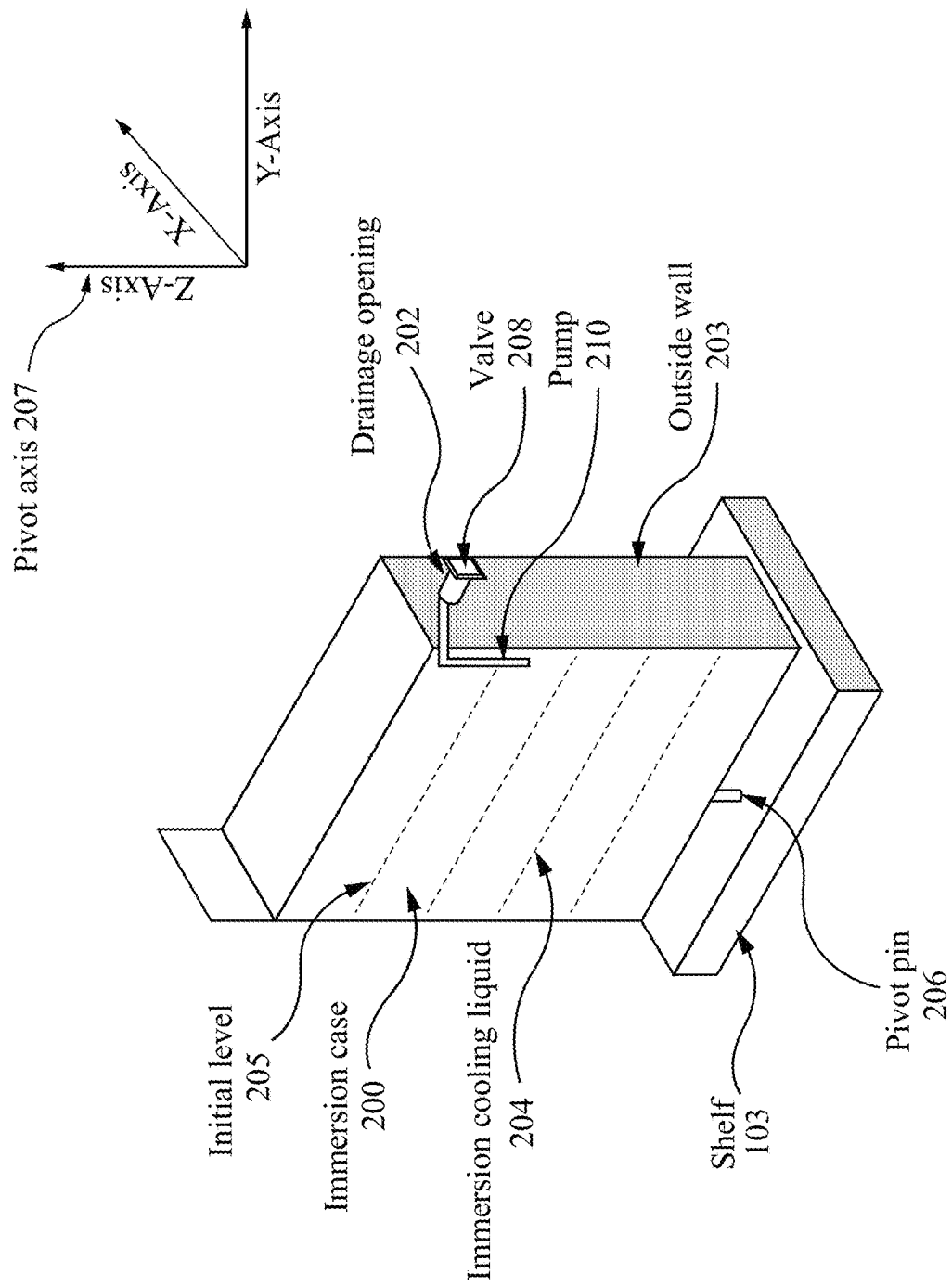

Referring to FIG. 6, in certain non-limiting embodiments, the drainage opening 202 may be a liquid-proof closing configured to be openable and closable, based on a user actuated action, such that, when the liquid-proof openable closing is opened, resulting from the user actuated action during the de-racking operation, the liquid-proof openable closing may allow the removal of at least a part of the dielectric immersion cooling liquid 204 from the immersion case 200. In certain non-limiting embodiments, the liquid-proof openable closing may include a valve 208 such that when the valve 208 may be opened by the user (i.e., user actuated action), the drainage opening 202 may allow at least a portion of the dielectric immersion cooling liquid 204 to be removed from the immersion case 200.

Further, in certain non-limiting embodiments, in addition to or alternatively, the immersion case 200 may further include a pump 210 coupled to the drainage opening 202. The pump 210 may pump out at least a part of the dielectric immersion cooling liquid 204 from the immersion case 200.

In certain non-limiting embodiments, resulting from the user actuated action, the immersion case 200 may pivot about the pivot axis 207 associated with the pivot pin 206 so that the top of the outside wall 203 protrudes from a face of the rack structure 102, in such a manner that the drainage opening 202 is lowered below the initial level 205 of the dielectric immersion cooling liquid 204 to allow removal of at least a part of the dielectric immersion cooling liquid 204 from the immersion case 200 during the de-racking operation.

In certain non-limiting embodiments, the immersion case 200 may be manually pivotable about the pivot axis 207. In other words, the user may manually pivot the immersion case 200 to remove the dielectric immersion cooling liquid 204 from the immersion case 200.

Figure 7:
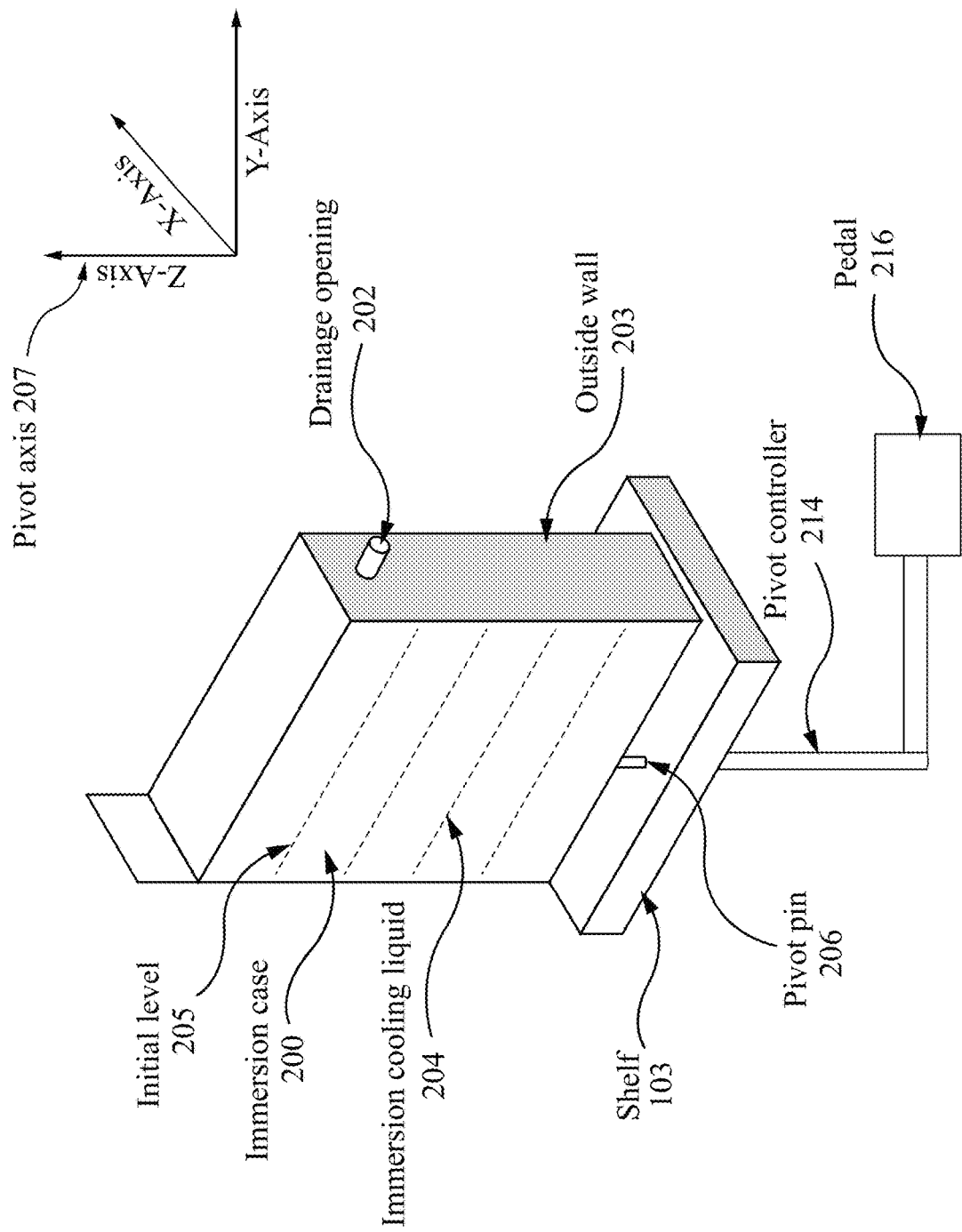

In certain non-limiting embodiments, the immersion case 200 may be mechanically pivotable about the pivot axis 207 associated with the pivot pin 206. Referring to FIG. 7, in certain non-limiting embodiments, the pivot pin 206 may be coupled a pedal 216 via a pivot controller 214 (e.g., a lever assembly or the like). In some of the non-limiting the pedal 216 may be located at the bottom of the rack structure 102. In other non-liming embodiments, the pedal 216 may be located at columns 105 (as shown in FIG. 1) of the rack structure 102. It is to be noted that the location of the pedal 216 should not limit the scope of present disclosure.

Based on the user actuated actions, for example pressing of the pedal 216, the pivot controller 214 may cause the pivot pin 206 to pivot, resulting in pivoting of the immersion case 200. In so doing, the dielectric immersion cooling liquid 204 may be drained out at least in part from the drainage opening 202. In certain non-limiting embodiments, the immersion case 200 may remain pivoted as long as the pedal 216 is being pressed by the user. In other non-limiting embodiments, the user may press the pedal 216 once and the immersion case 200 may remain pivoted and, resulting from a second user actuated action, for example pressing again the pedal 216, the immersion case 200 may return to its original position.

It is to be noted that the mechanical structure including the pedal 216 to pivot the immersion case 200 may be one non-limiting embodiment of the present disclosure. In one non-limiting embodiment, the shelf 103 may define a cavity or a stopper onto which the immersion case 200 may be racked in such a manner that the immersion case 200 may be pivoted to remove at least a portion of the dielectric immersion cooling liquid 204. In another non-limiting embodiment, a handle may be coupled to the outside wall 203 of the immersion case 200 such that the handle may assist the user to pivot the immersion case 200.

Figure 8:
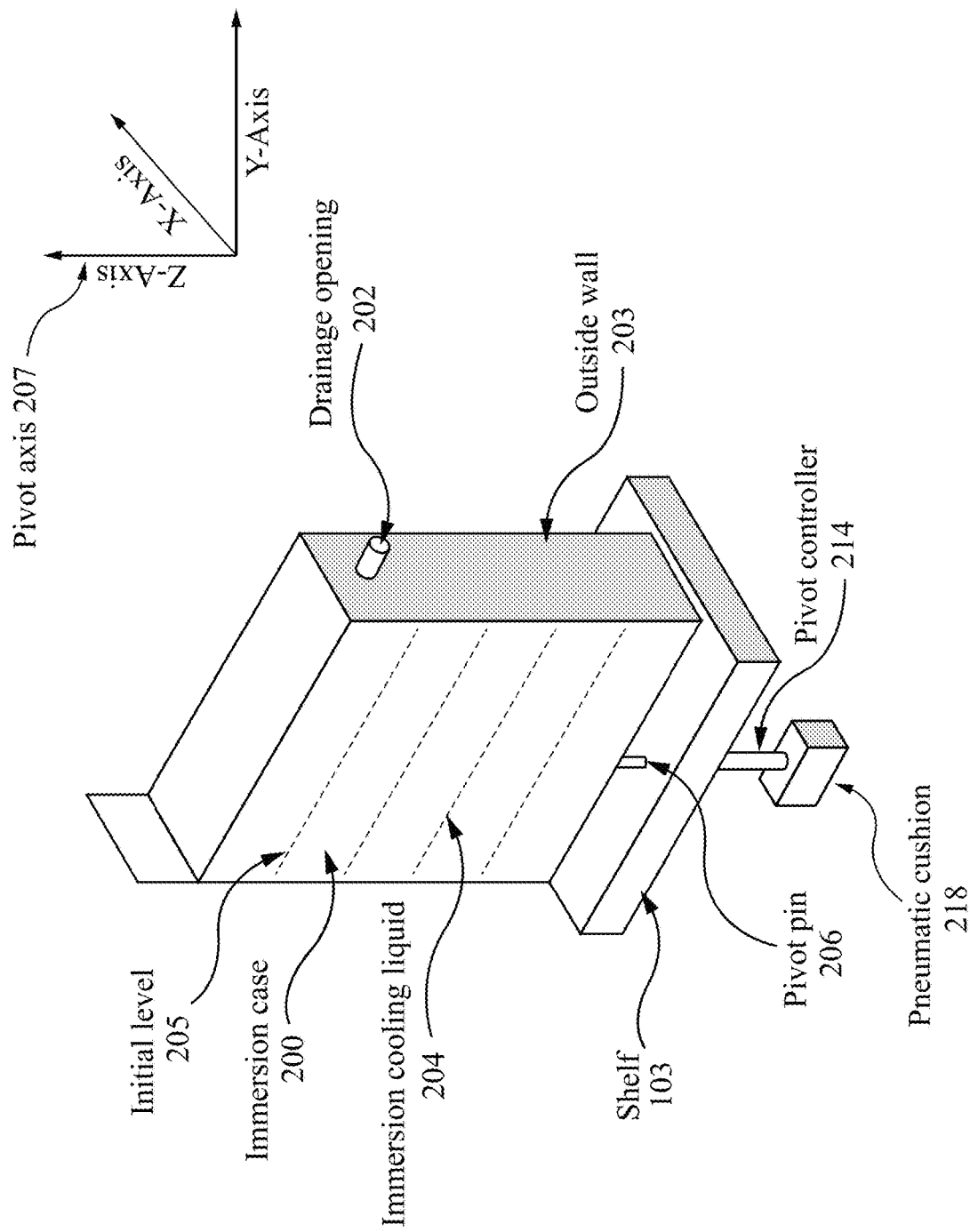

In certain non-limiting embodiments, the immersion case 200 may be pneumatically pivotable about the pivot axis 207 associated with the pivot pin 206. Referring to FIG. 8, in certain non-limiting embodiments, the pivot pin 206 may be coupled to a pneumatic cushion 218 via the pivot controller 214 (e.g., a pneumatic tube or the like). In some of the non-limiting embodiments, the pneumatic cushion 218 may be located below the shelf 103 of the rack structure 102 where the immersion case 200 is located. In other non-liming embodiments, the pneumatic cushion 218 may be located at some other location in the rack structure 102. It is to be noted that the location of the pneumatic cushion 218 does not limit the scope of present disclosure.

Resulting from the user actuated actions, for example actuating pneumatic cushion 218, the pivot controller 214 may pivot the pivot pin 206 resulting in pivoting of the immersion case 200. In so doing, the dielectric immersion cooling liquid 204 may be drained out at least in part from the drainage opening 202. In certain non-limiting embodiments, the immersion case 200 may remain pivoted as long as the pneumatic cushion 218 is being actuated by the user. In other non-limiting embodiments, the user may actuate the pedal 216 once and the immersion case 200 may remain pivoted and, resulting from a second user actuated action, for example again actuating the pneumatic cushion 218, the immersion case 200 may return to its original position.

It is to be noted that the pneumatic structure including the pneumatic cushion 218 to pivot the immersion case 200 may be one non-limiting embodiment of the present disclosure. Various other pneumatic structures, such as for example, a, hook, cables, a pulley, or the like may be used to pivot the immersion case 200.

In certain non-liming embodiments, irrespective of the pivoting mechanism (e.g., manual, mechanical, or pneumatic), the immersion case 200 may pivot between 0 to 45 degrees about the pivot axis 207.

Figure 9:
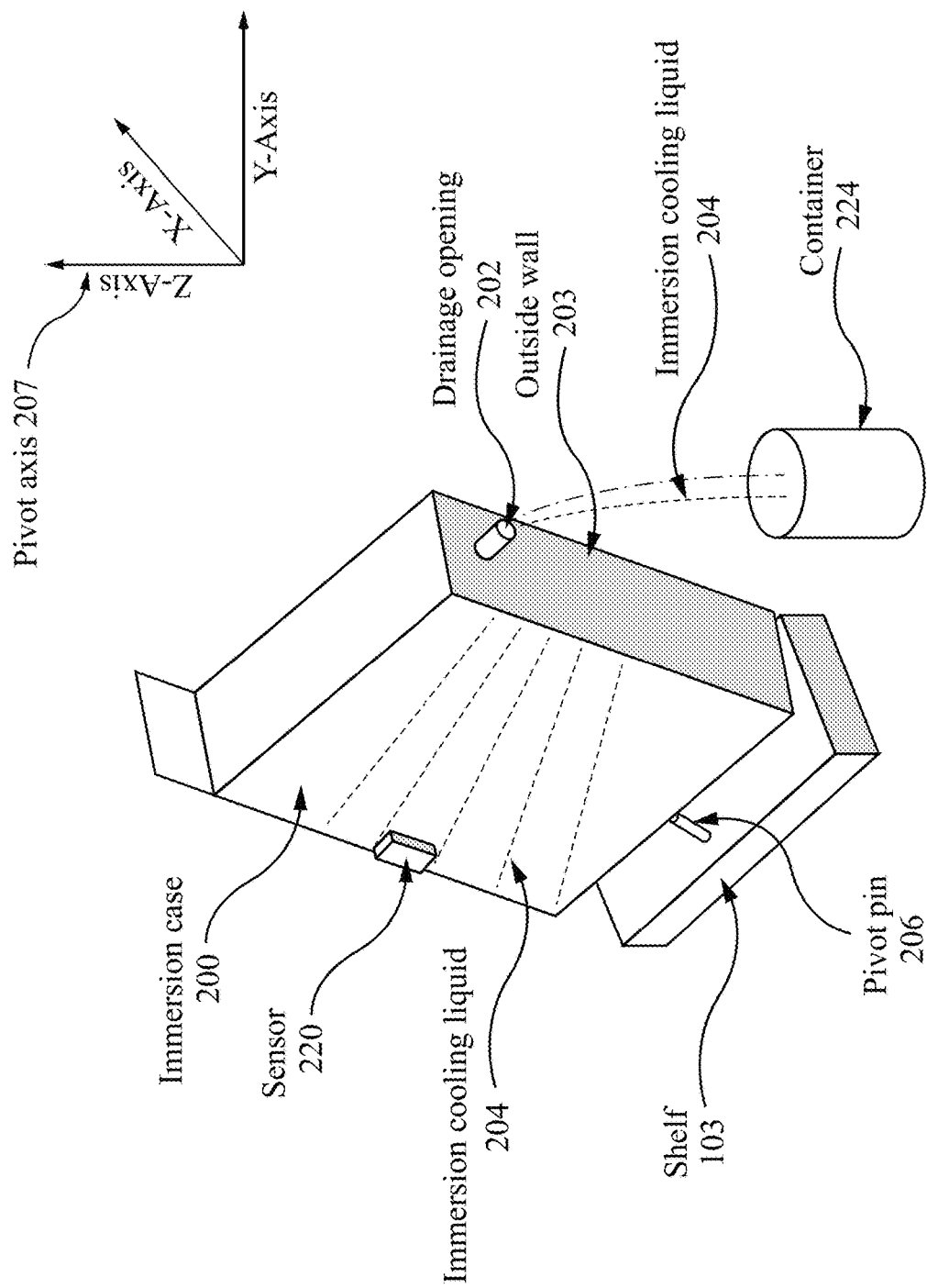

FIG. 9 illustrates a perspective view of the immersion case 200 being pivoted to remove at least a part of the dielectric immersion cooling liquid 204. As shown, the immersion case 200 may be pivoted around the pivot axis 207 resulting from the user actuated action (as previously discussed).

In certain non-limiting embodiments, the immersion case 200 may include a sensor 220 to determine and indicate a level of the dielectric immersion cooling liquid 204 in the immersion case 200. In certain non-limiting embodiments, the sensor 220 may be a float sensor. In other non-limiting embodiments, the sensor 220 may be an optical sensor positioned in view of a transparent window (not shown) formed on a side of the immersion case 200. In certain non-limiting embodiments, the sensor 220 may output an audio, visual or both the audio and visual indication about the level of dielectric immersion cooling liquid 204. The indication from the sensor 220 may assist the user to determine that a sufficient part of the dielectric immersion cooling liquid 204 has been removed from the immersion case 200 and that the immersion case 200 may be de-racked from the rack structure 102 without spilling out the dielectric immersion cooling liquid 204. Sending a signal from the sensor 220 to an external monitoring device (not shown) is also contemplated.

In certain non-limiting embodiments, the dielectric immersion cooling liquid 204 may be collected in a container 224. In certain non-limiting embodiments, the dielectric immersion cooling liquid 204 collected in the container 224 may be inserted back to the immersion case 200 during the racking operation.

Thus, by virtue of the immersion case 200 including the drainage opening 202 may provide an efficient mechanism to remove the dielectric immersion cooling liquid 204 from the immersion case 200 prior to de-racking. Thereby, preventing the dielectric immersion cooling liquid 204 from spilling out of the immersion case 200.

It will also be understood that, although the embodiments presented herein have been described with reference to specific features and structures, it is clear that various modifications and combinations may be made without departing from such disclosures. The specification and drawings are, accordingly, to be regarded simply as an illustration of the discussed implementations or embodiments and their principles as defined by the appended claims, and are contemplated to cover any and all modifications, variations, combinations or equivalents that fall within the scope of the present disclosure.

What is claimed is:

1. A rack system for housing an electronic device, comprising:
   an immersion case configured to provide housing to the electronic device, and to receive an immersion cooling liquid, wherein the immersion case includes a drainage opening, wherein:
   the immersion case is further configured to pivot about a pivot axis,
   the drainage opening is configured to open in response to a user actuated action causing the immersion case to pivot about the pivot axis, and, after the drainage opening is open, remove at least a part of the immersion cooling liquid from the immersion case during a de-racking operation of the immersion case; and
   a rack frame configured to slidably accommodate racking and de-racking operations of the immersion case.

2. The rack system of claim 1, wherein the drainage opening is a liquid-proof closing configured to be openable and closable such that, when the liquid-proof closing is opened, based on the user actuated action, the liquid-proof closing allows removal of at least a part of the immersion cooling liquid from the immersion case during the de-racking operation.

3. The rack system of claim 1, wherein the drainage opening further comprises one or more of a valve and a pump to remove at least a part of the immersion cooling liquid.

4. The rack system of claim 1, wherein the immersion case is coupled to a pivot pin.

5. The rack system of claim 4, wherein the pivot axis is associated with the pivot pin.

6. The rack system of claim 4, wherein the pivot pin is coupled to a pneumatic cushion and the pneumatic cushion causes the immersion case to pneumatically pivot about the pivot axis.

7. The rack system of claim 4, wherein the pivot pin is coupled to a pedal and the pedal causes the immersion case to mechanically pivot about the pivot axis.

8. The rack system of claim 1, wherein the immersion case is manually pivotable about the pivot axis.

9. The rack system of claim 1, wherein the immersion case is mechanically pivotable about the pivot axis.

10. The rack system of claim 1, wherein the immersion case is pneumatically pivotable about the pivot axis.

11. The rack system of claim 1, wherein the immersion case is configured to pivot between 0 to 45 degrees about the pivot axis.

12. The rack system of claim 1, wherein the immersion case further includes a sensor configured to determine and indicate a level of the immersion cooling liquid in the immersion case.

13. The rack system of claim 1, wherein the immersion cooling liquid is a dielectric immersion cooling liquid.

14. The rack system of claim 1, wherein the immersion case is stacked vertically in the rack frame.

15. A rack system for housing an electronic device, comprising:
    an immersion case configured to provide housing to the electronic device, and to receive an immersion cooling liquid, wherein:
    the immersion case includes a drainage opening,
    the immersion case is coupled to a pivot pin and is further configured to pivot about a pivot axis,
    the pivot pin is coupled to a pneumatic cushion and the pneumatic cushion causes the immersion case to pneumatically pivot about the pivot axis, and
    the drainage opening is configured to remove at least a part of the immersion cooling liquid from the immersion case, based on a user actuated action causing the immersion case to pivot about the pivot axis, during a de-racking operation of the immersion case; and
    a rack frame configured to slidably accommodate racking and de-racking operations of the immersion case.

16. The rack system of claim 15, wherein the pivot pin is coupled to a pedal and the pedal causes the immersion case to mechanically pivot about the pivot axis.

17. The rack system of claim 15, wherein the immersion case is configured to pivot between 0 to 45 degrees about the pivot axis.

18. The rack system of claim 15, wherein the immersion case further includes a sensor configured to determine and indicate a level of the immersion cooling liquid in the immersion case.

19. The rack system of claim 15, wherein the immersion cooling liquid is a dielectric immersion cooling liquid.

20. The rack system of claim 15, wherein the immersion case is stacked vertically in the rack frame.

* * * * *